US006992372B2

(12) United States Patent
Sumi

(10) Patent No.: US 6,992,372 B2
(45) Date of Patent: Jan. 31, 2006

(54) FILM CARRIER TAPE FOR MOUNTING ELECTRONIC DEVICES THEREON

(75) Inventor: Shinichi Sumi, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 22 days.

(21) Appl. No.: 10/741,425

(22) Filed: Dec. 22, 2003

(65) Prior Publication Data

US 2005/0056915 A1      Mar. 17, 2005

(30) Foreign Application Priority Data

Dec. 24, 2002    (JP)    .............................. 2002-371778

(51) Int. Cl.
*H01L 23/495*    (2006.01)
*H05K 1/00*    (2006.01)

(52) U.S. Cl. ...................... 257/668; 257/669; 257/695; 257/730; 257/786; 174/250; 174/255; 174/256; 174/259

(58) Field of Classification Search ........ 257/668–669, 257/695, 730, 786; 174/250, 255, 256, 259; 361/767–768, 771, 773
See application file for complete search history.

(56) References Cited

U.S. PATENT DOCUMENTS 6,320,135 B1 * 11/2001 Saito ......................... 174/250

FOREIGN PATENT DOCUMENTS

JP          2002-299385 A       10/2002

* cited by examiner

*Primary Examiner*—Donghee Kang
(74) *Attorney, Agent, or Firm*—Sughrue Mion, PLLC

(57) ABSTRACT

The present invention provides a flat film carrier tape for mounting electronic devices thereon which tape can enhance reliability of a semiconductor chip mounting line. The film carrier tape includes a continuous insulating layer, a wiring pattern formed of a conductor layer provided on a surface of the insulating layer, a row of sprocket holes provided along respective longitudinal edges of the insulating layer, which said row of sprocket holes are at the outer sides of the wiring pattern, and a metallic layer formed around said row of sprocket holes, wherein the metallic layer is provided in a discontinuous manner in the longitudinal direction of the insulating layer by provision of slits on the insulating layer at intervals of three to eight said sprocket holes. Through employment of the above structure, stress produced between the metallic layer and the insulating layer is appropriately released by the provided slits, thereby preventing wavy deformation along the longitudinal edges of the both sides of the film carrier tape.

4 Claims, 2 Drawing Sheets

FILM CARRIER TAPE FOR MOUNTING ELECTRONIC DEVICES THEREON

BACKGROUND OF THE INVENTION

1. Field of the Invention

The present invention relates to a film carrier tape on which electronic devices such as IC Chips and LSI Chips are to be mounted.

2. Description of the Related Art

Development of the electronics industry has been accompanied by sharp demand for printed-circuit boards for mounting electronic devices thereon, such as IC (Integrated Circuits) Chips and LSI (Large-Scale Integrated circuits) Chips. Manufacturers have attempted to realize small-size, light-weight, and high-function electronic equipment, which has long been desired. To this end, manufactures have recently come to employ a film carrier tape, such as a COF tape, a TAB tape, a T-BGA tape, or an ASIC tape. Use of film carrier tapes has become increasing important, especially for manufacturers of personal computers, cellular phones, and other electronic equipment employing a liquid crystal display (LCD) that must have high resolution and flatness, as well as a narrow screen-frame area.

Such a film carrier tape for mounting electronic devices thereon is produced by providing, for example, sprocket holes for conveying the film carrier tape, device holes, and other holes in an insulating layer made of polyimide; subsequently providing copper foil on a surface of the insulating layer by the mediation of an adhesive layer; patterning the copper foil while the insulating layer is conveyed with the sprocket holes, to thereby form a wiring pattern; and subsequently forming a solder resist layer on the wiring pattern in accordance with needs.

After completion of the steps of producing a film carrier tape for mounting electronic devices thereon, there is performed a reeling step in which the produced film carrier tape is reeled with an embossed spacer film which has concavo-convex surface form.

For example, in the solder resist curing step, a solder resist coating layer formed on the wiring pattern is thermally cured to some extent, and the thus-treated film carrier tape is reeled with an embossed spacer film and heated again so as to completely cure the solder resist coating layer, thereby forming a solder resist layer.

Meanwhile, there has arisen demand for considerably reducing the thickness of such a film carrier tape itself for mounting electronic devices thereon, in order to keep pace with a trend for downsizing of electronic devices. Thus, in recent years, a COF (chip on film) tape employing a relatively thin insulating layer has been proposed.

However, the aforementioned COF tape having a thin insulating layer causes deformation of sprocket holes during conveyance of the tape, since wiring patterns and similar elements are formed on the aforementioned film carrier tape for mounting electronic devices thereon while the insulating layer is continuously conveyed. Thus, the COF tape has drawbacks that wiring patterns, solder resist patterns, etc. cannot be formed on predetermined positions with high precision and that electronic parts cannot be mounted with high precision.

In order to overcome the aforementioned drawbacks, there has been provided a tape structure in which a dummy wiring portion (metallic layer) is provided around each sprocket hole in a discrete manner, whereby the tape maintains suitable mechanical strength during conveyance thereof (see, for example, Japanese Patent Application Laid-Open (kokai) No. 2002-299385 (FIG. 1)).

However, the aforementioned film carrier tape for mounting electronic devices thereon provided with a dummy wiring portion also has a drawback in that wavy deformation is generated along the opposite longitudinal edges of the both sides thereof during the final production stage as the film carrier tape for mounting electronic devices thereon.

Such wavy deformation is not observed in customary film carrier tape products employing no dummy wiring portion around sprocket holes and is considered to be generated for the following reason. Specifically, under application of pressure to the film carrier tape (e.g., in a reeling step employing an embossed spacer film), differences in physical properties between the metallic layer and the insulating layer; e.g., differences in linear expansion coefficient, tensile strength, percent elongation, and similar properties, complicatedly affect the film carrier tape for mounting electronic devices thereon upon treatment in production steps such as heating or cooling.

Such a film carrier tape for mounting electronic devices thereon having wavy deformation cannot be conveyed and positioned smoothly by use of a pin roller or a similar device in a semiconductor chip mounting line. As a result, failure such as mount failure of electronic parts is induced, leading to failure of final products, which is problematic.

SUMMARY OF THE INVENTION

The present inventors have carried out extensive studies in order to solve the aforementioned problems, and have found that the problems can be solved by use of a film carrier tape for mounting electronic devices thereon which has a specific configuration. The present invention has been accomplished on the basis of this finding. Thus, an object of the present invention is to provide a flat film carrier tape for mounting electronic devices thereon, which tape can enhance reliability of a semiconductor chip mounting line.

Accordingly, in one aspect of the present invention, there is provided a film carrier tape for mounting electronic devices thereon, comprising a continuous insulating layer; a wiring pattern formed of a conductor layer provided on a surface of the insulating layer, a row of sprocket holes being provided along respective longitudinal edges of the insulating layer, which said row of sprocket holes are at the outer sides of the wiring pattern; and a metallic layer formed around said row of sprocket holes, wherein the metallic layer is provided in a discontinuous manner in the longitudinal direction of the insulating layer by provision of slits on the insulating layer at intervals of three to eight said sprocket holes.

Through employment of the above structure, stress produced between the metallic layer and the insulating layer is appropriately released by the provided slits, thereby preventing wavy deformation of the film carrier tape for mounting electronic devices thereon. Thus, a flat film carrier tape for mounting electronic devices thereon can be provided, thereby enhancing reliability of a semiconductor chip mounting line.

The metallic layer may have a length in the longitudinal direction of 10 to 40 mm, corresponding to three to eight said sprocket holes.

Through employment of the structure, wavy deformation of the film carrier tape for mounting electronic devices thereon is prevented, thereby enhancing reliability of a semiconductor chip mounting line.

In the film carrier tape for mounting electronic devices thereon, the outer longitudinal edge of the metallic layer is preferably set back from its corresponding closest longitudinal edge of the insulating layer at a predetermined distance.

Through employment of the above structure, contact between the metallic layer and a guide or a similar element provided in a tape conveyance route can be prevent d, thereby preventing wiring failure such as a short circuit. In addition, even though the tape conveying route is bent, the tape can be conveyed in accordance with the bent conveying route, thereby attaining satisfactory tape conveyance.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which.

DETAILED DESCRIPTION OF THE PREFERRED EMBODIMENTS

Figure 1A:
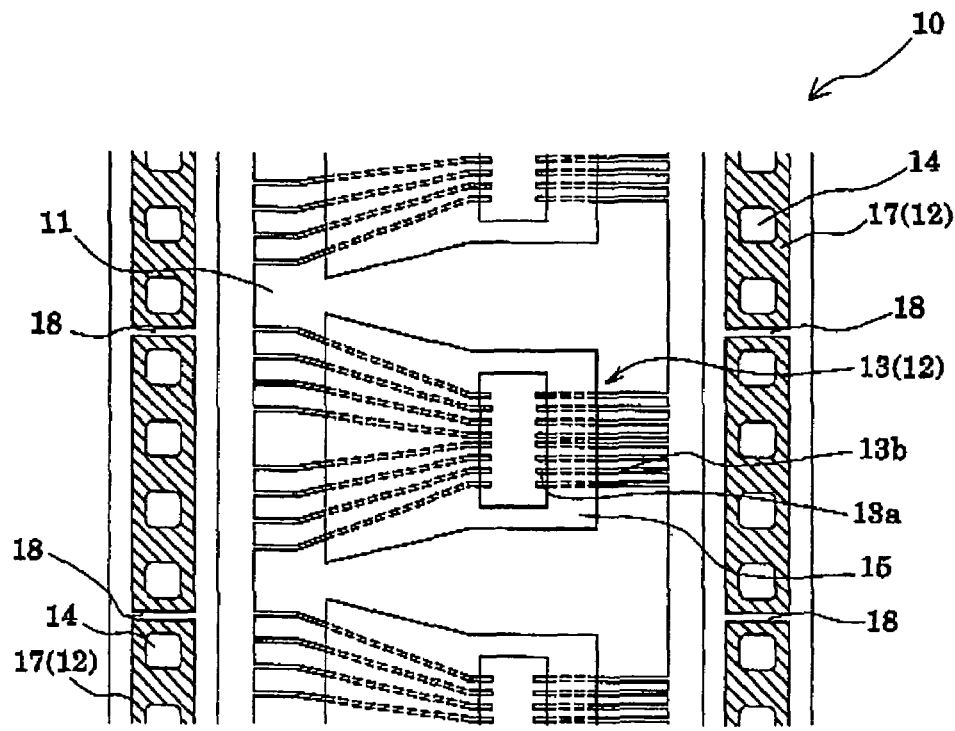
FIG. 1A and FIGS. 1B and 1C are a plan view and cross-sectional views, respectively, that schematically show a film carrier tape for mounting electronic devices thereon, according to a first embodiment of the present invention.
Figure 1B:
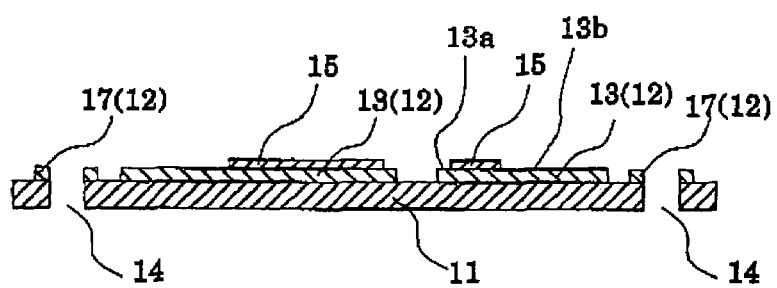
Figure 1C:
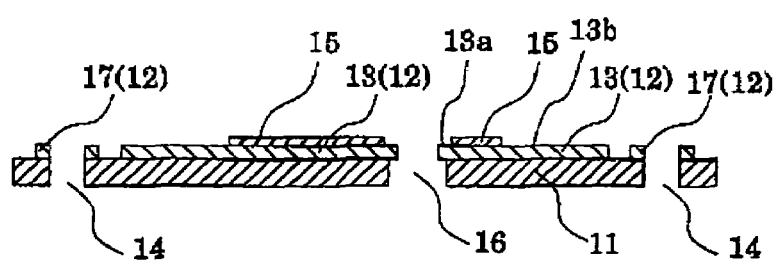

FIGS. 1A and FIGS. 1B and 1C are a plan view and a cross-sectional view, respectively, schematically showing a film carrier tape for mounting electronic devices thereon, according to a first embodiment of the present invention.

As shown in these figures, a film carrier tape 10 for mounting electronic devices thereon (hereinafter the tape may be referred to simply as "film carrier tape") is a COF film carrier tape. A wiring pattern 13 formed of a conductor layer 12 is provided on a surface of an insulating layer 11 serving as a film carrier tape substrate. The insulator layer 11 has a pair of transversely spaced rows of sprocket holes 14 provided along respective longitudinal edges of the insulating layer 11; this is, the two rows of sprocket holes 14 are disposed such that one row extends along each of the longitudinal edges of the outer sides of the wiring pattern 13.

A plurality of wiring patterns 13 are continuously provided on a surface of the insulating layer 11, with each wiring pattern 13 having dimensions generally corresponding to those of electronic parts to be mounted. The wiring patterns 13 are formed by patterning the conductor layer 12 provided on the insulating layer 11.

On each wiring pattern 13, a solder resist layer 15 is formed by applying a solder resist coating solution through screen printing. Specifically, as shown in FIGS. 1A and 1B, inner leads 13a, which are portions of the wiring pattern 13, are provided in a center of the wiring pattern 13 such that each inner lead 13a extends to a portion on which a semiconductor chip is mounted. Outer leads 13b, which are portions of the wiring pattern 13 and serve as external connector terminals, are provided such that each outer lead 13b extends to a portion outside the solder resist layer 15 and opposite the inner leads 13a. Notably, as shown in FIG. 1C, a device hole 16 may be provided in the center of the wiring pattern. Similar to the case of sprocket holes 14, perforation of the device hole 16 is carried out by, for example, punching through the insulating layer 11.

The insulating layer 11 may be formed from polyester, polyamide, polyether sulfone, or a liquid crystal polymer, as well as polyimide. Among these polymers, an aromatic polyimide (all repeating units being aromatic) synthesized from pyromellitic dianhydride and an aromatic diamine (e.g., Kapton, product of Du Pont-Toray Co., Ltd.) and an aromatic polyimide (all repeating units being aromatic) having a biphenyl skeleton (e.g., UPILEX, product of Ube Industries, Ltd.) are particularly preferred. The thickness of the insulating layer 11 generally falls within a range of 12.5 to 75 $\mu$m, preferably 25 to 75 $\mu$m.

The conductor layer 12 may be formed of a material such as copper, gold, or silver. Among these metallic materials, copper foil is generally used. Any type of copper foil, such as electrodeposited copper foil or rolled copper foil, can be employed. The thickness of the conductor layer 12 generally falls within a range of 1 to 70 $\mu$m, preferably 5 to 35 $\mu$m.

In the first embodiment, a metallic layer 17 is provided around sprocket holes 14 so as to reinforce regions including the sprocket holes 14 during conveying and positioning of semiconductor chips for mounting thereof.

Specifically, the metallic layer 17 is provided in a discontinuous manner in the longitudinal direction of the insulating layer 11 by means of slits 18 provided on the insulating layer 11 at intervals of three to eight sprocket holes 14. In other words, one metallic layer 17 is provided in a continuous manner in the longitudinal direction of the insulating layer 11 throughout a group including three to eight sprocket holes 14, and a plurality of the sprocket hole groups 14 are provided in a discrete manner by provision of slits 18.

For example, in the present embodiment, the metallic layer 17 is provided in a discontinuous manner in the longitudinal direction of the insulating layer 11 by provision of slits 18 on the insulating layer 11 at intervals of four sprocket holes 14. The metallic layer 17 is provided so as not to be in contact with the wiring patterns 13 formed through patterning of the conductor layer 12 and provided around the sprocket holes 14 so as to serve as, for example, a dummy wiring portion for reinforcing sprocket hole regions 14.

The aforementioned metallic layer 17 has a length in the longitudinal direction of 10 to 40 mm, corresponding to three to eight sprocket holes 14, preferably a length in the longitudinal direction of 10 to 30 mm, corresponding to three to six sprocket holes 14. In the present embodiment, the length of the metallic layer is 19 mm, corresponding to four sprocket holes 14. Standards of EIAJ (Electronics Industries Association of Japan) stipulate that the standard interval between the sprocket holes 14 is 4.75±0.05 mm.

According to the first embodiment, the metallic layer 17 is provided in a discontinuous manner in the longitudinal direction of the insulating layer 11 by provision of slits 18 on the insulating layer 11 at intervals of four sprocket holes 14. Therefore, stress produced between the metallic layer 17 and the insulating layer 11 is appropriately released by the provided slits 18, thereby preventing wavy deformation of the final product; i.e., the film carrier tape 10, along the longitudinal edges of the both sides thereof. The relationship between stress and wavy deformation will be described in detail hereafter.

In the present embodiment, the outer longitudinal edge of the metallic layer 17 is set back from its corresponding closest longitudinal edge of the insulating layer 11 at a predetermined distance. Thus, employment of the above structure, in which the metallic layer 17 does not extend to the longitudinal edge of the insulating layer 11 and the outer longitudinal edge of the metallic layer 17 is set back from its corresponding closest longitudinal edge of the insulating layer 11 at a predetermined distance, prevents failure of the wiring pattern 13, such as a short circuit. More specifically, formation of metallic fragments(powder) through contact between the metallic layer 17 and a guide or a similar element provided in a tape conveyance route can be prevented during conveyance of the insulating layer 11 in manufacturing the film carrier tape, thereby preventing failure of the wiring pattern 13, such as a short circuit caused by contact between the wiring pattern 13 and the formed metallic fragments (powder).

In addition, the rigidity of the entirety of the film carrier tape is not excessively high. Therefore, even though the tape conveying route is bent, the tape itself can be conveyed in accordance with the bent conveying route, thereby attaining satisfactory tape conveyance.

The film carrier tape 10 having such a structure for mounting electronic devices thereon is cut into strips each having an area on which five to ten semiconductor chips are mounted. The strips are fed to a mounting apparatus where electronic devices such as semiconductor chips are mounted. Upon mounting the devices, the film carrier tape maintains mechanical strength sufficient for preventing deformation of the sprocket hole regions 14, since the metallic layer 17 is provided around the sprocket holes 14. Thus, high-precision mounting of electronic devices can be attained.

A method of manufacturing the above-described film carrier tape 10 according to the first embodiment will now be described with reference to FIGS. 2A through 2F, which are transverse cross-sectional views illustrating a progressive succession of steps of the method.

In the manufacturing method of this embodiment, after completion of the below-mentioned steps of manufacturing a film carrier tape, there is performed a reeling step in which the produced film carrier tape (COF laminate film) is reeled with an embossed spacer film (not illustrated). The embossed spacer film has a pair of rows of concavo-convex parts provided along respective longitudinal edges thereof. The distance between the pair of rows of concavo-convex parts in the width direction of the embossed spacer film is almost the same as the distance between a pair of rows of sprocket holes in the width direction of the film carrier tape.

Figure 2A:
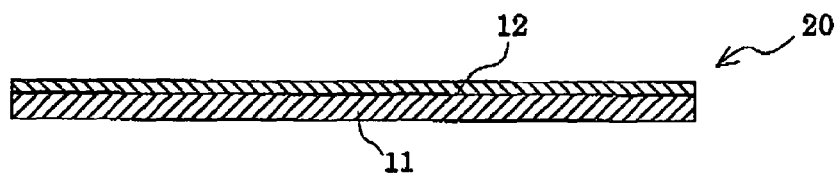
FIGS. 2A through 2F are transverse cross-sectional views illustrating a method of manufacturing the film carrier tape according to the first embodiment.

First, as shown in FIG. 2A, there is prepared a COF laminate film 20 in which a conductor layer 12 is formed on an insulating layer 11.

Figure 2B:
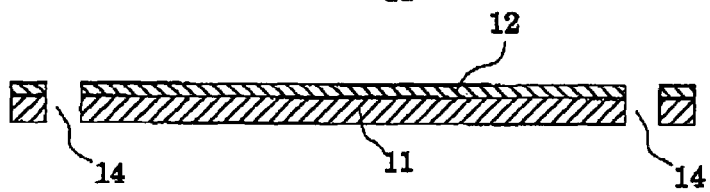

Then, as shown in FIG. 2B, a plurality of sprocket holes 14 are perforated through the insulating layer 11 and the conductor layer 12 by, for example, punching. This perforation of the sprocket holes 14 may be carried out from the top side of the insulating layer 11 or from the bottom side of the insulating layer 11.

Figure 2C:
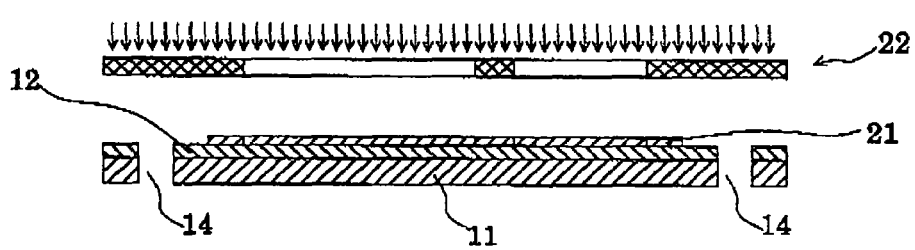

Subsequently, as shown in FIG. 2C, a photoresist layer 21 is formed on the conductor layer 12 through a customary photolithographic method by applying a photoresist material coating solution to a pattern-forming region in which the wiring pattern 13 is to be formed. The insulating layer 11 is positioned by means of positioning pins inserted in the sprocket holes 14. After positioning of the insulating layer 11, the photoresist layer 21 is exposed through a photomask 22 and developed, to thereby perform patterning, thereby forming a resist pattern 23 for providing a wiring pattern as shown in FIG. 2D.

Figure 2D:
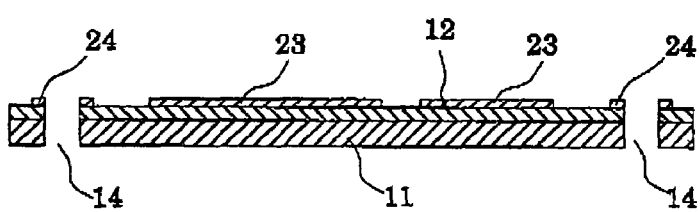

In the present embodiment, as shown in FIG. 2D, a resist pattern 24 for providing a metallic layer 17 is formed through the transfer method by applying a resist material coating solution onto each region corresponding to four sprocket holes 14. Specifically, in the present embodiment, the resist pattern 24 for providing a metallic layer is provided such that slits (i.e., predetermined apace) 18 are provided on the insulating layer at intervals of four sprocket holes 14.

The resist pattern 24 for providing a metallic layer may be formed before formation of the resist pattern 23 for providing a wiring pattern or may be formed separately through the transfer method before formation of the sprocket holes 14. Alternatively, the resist pattern 24 for providing a metallic layer may be formed at the same time formation of the resist pattern 23 for providing a wiring pattern, to thereby perform patterning of the photoresist layer.

Figure 2E:
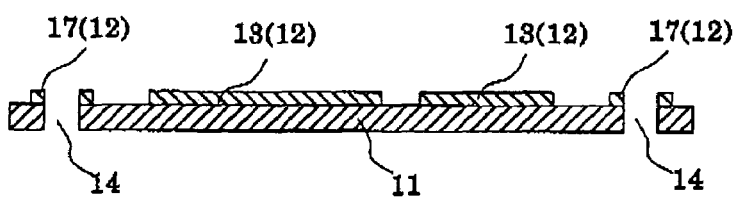

Then, with the resist pattern 23 for providing a wiring and the resist pattern 24 for providing a metallic layer serving as mask patterns, the conductor layer 12 is dissolved and removed by an etching solution, whereupon the resist patterns 23 and 24 are dissolved and removed by an alkaline solution. As a result, a wiring pattern 13 and a metallic layer 17 are formed as shown in FIG. 2E. In this case, as described above, in the present embodiment, the resist pattern 24 for providing a metallic layer is provided such that slits 18 are provided on the insulating layer at intervals of four sprocket holes 14. Therefore, the metallic layer 17 is provided in a discontinuous manner by the slits 18 provided between groups of the sprocket holes 14 (see FIG. 1A).

Figure 2F:
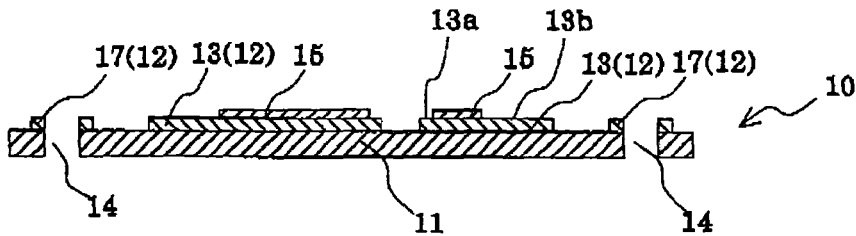

Subsequently, as shown in FIG. 2F, a solder resist layer 15 is formed through, for example, screen printing. For example, in the present embodiment, the solder resist layer 15 is formed such that the center of each wiring pattern 13 is surrounded by the solder resist layer 15, whereby inner leads 13a are formed in the center of the wiring pattern 13 and outer leads 13b are formed outside the solder resist layer 15 (see FIG. 1). Thus, the film carrier tape 10 shown in FIGS. 1A and 1B is produced.

Notably, the aforementioned metallic layer 17 and insulating layer 11 differ in terms of physical properties; e.g., exhibit differences in linear expansion coefficient, tensile strength, percent elongation, and similar properties. Therefore, in the case of manufacture of a conventional film carrier tape in which a metallic layer is provided in a discrete manner around each sprocket hole, pressure is applied to the film carrier tape (e.g., in a reeling step in which the film carrier tape is reeled with an embossed spacer film). Also, a similar property complicatedly affects the film carrier tape upon treatment in production steps such as repeated heating and cooling. As a result, a difference in stress between the metallic layer and the insulating layer is produced. Thus, wavy deformation is considered to be generated because of the difference in stress in the film carrier tape products along the opposite longitudinal edges of the both sides thereof after manufacture thereof.

Based on the above consideration, in an attempt to manufacture a flat film carrier tape by appropriately releasing the stress between the insulating layer and the metallic layer, the present inventors have studied the effects of the number of sprocket holes included in a group separated by the slits on the metallic layer, in consideration of the balance of material-based physical properties of the insulating layer and the metallic layer.

Specifically, in the following Examples and Comparative Examples film carrier tape samples having various intervals between the slits were manufactured through the aforementioned manufacturing method, to thereby determine optimum conditions for appropriately releasing the stress produced between the metallic layer and the insulating layer, so as to prevent wavy deformation in the film carrier tape along the longitudinal edges of the both sides thereof.

EXAMPLES

Example 1

A film carrier tape of Example 1 was produced by providing slits for causing a metallic layer to be discontinued at intervals of three sprocket holes (SH).

Example 2

The procedure of Example 1 was repeated, except that slits for causing a metallic layer to be discontinued were provided at intervals of five sprocket holes (SH), to thereby produce a film carrier tape of Example 2.

Example 3

The procedure of Example 1 was repeated, except that slits for causing a metallic layer to be discontinued were provided at intervals of eight sprocket holes (SH), to thereby produce a film carrier tape of Example 3.

Comparative Example 1

The procedure of Example 1 was repeated, except that slits for causing a metallic layer to be discontinued were provided at intervals of one sprocket hole (SH), to thereby produce a film carrier tape of Comparative Example 1.

Comparative Example 2

The procedure of Example 1 was repeated, except that slits for causing a metallic layer to be discontinued were provided at intervals of two sprocket holes (SH), to thereby produce a film carrier tape of Comparative Example 2.

Comparative Example 3

The procedure of Example 1 was repeated, except that slits for causing a metallic layer to be discontinued were provided at intervals of nine sprocket holes (SH), to thereby produce a film carrier tape of Comparative Example 3.

Comparative Example 4

The procedure of Example 1 was repeated, except that slits for causing a metallic layer to be discontinued were provided at intervals of eleven sprocket holes (SH), to thereby produce a film carrier tape of Comparative Example 4.

Test Example

Each of the film carrier tape samples of Examples 1 to 3 and Comparative Examples 1 to 4 was placed on a base plate. In the case where a portion of the sample along the longitudinal edges of the both sides of the film carrier tape was observed to be rising from the base plate, the sample was evaluated as having wavy deformation. The level of deformation was evaluated with the following ratings:

X; deformation which definitely disturbs conveyance of the tape,

Δ; deformation which may disturb conveyance of the tape, and

○; no deformation, or deformation which does not disturb conveyance of the tape. The results are shown in Table 1.

TABLE 1

|  | Slit intervals (No. of SHs) | Evaluation |
| --- | --- | --- |
| Comp. Ex. 1 | 1 | X |
| Comp. Ex. 2 | 2 | Δ |
| Example 1 | 3 | ○ |
| Example 2 | 5 | ○ |
| Example 3 | 8 | ○ |
| Comp. Ex. 3 | 9 | Δ |
| Comp. Ex. 4 | 11 | X |

As is clear from Table 1, virtually no wavy deformation was observed along the longitudinal edges of each film carrier tape samples of Examples 1 to 3 having slits on the metallic layer at intervals of three to eight sprocket holes. The absence of wavy deformation may be due to appropriate release of the stress produced between the metallic layer and the insulating layer, as compared with the film carrier tape samples of Comparative Examples 1 to 4.

The results indicate that, by providing slits on the metallic layer of a film carrier tape at intervals of three to eight sprocket holes, wavy deformation along the longitudinal edges of the film carrier tape can be prevented.

Other Embodiments

Needless to say, the film carrier tape for mounting electronic devices thereon according to the present invention is not limited to the aforementioned embodiment of the present invention.

The aforementioned embodiment has been described by taking as an example a film carrier tape 10 having one row of carrier patterns including the wiring pattern 13 and the sprocket holes 14. However, the present invention is not limited to this embodiment, and a film carrier tape may have a plurality of rows of carrier patterns.

Furthermore, the aforementioned embodiment has been described while taking a COF film carrier tape as an example. However, the film carrier tape of the present invention may assume the form of another film carrier tape for mounting electronic devices thereon of a type such as TAB, CSP, BGA, μ-BGA, FC, or QFP, and no particular limitation is imposed on the constitution of the film carrier tape.

In the above-described embodiment, no component layer is provided on the metallic layer 17. However, a layer; for example, a plating layer, may be provided on a surface of the metallic layer, whereby the effect on reinforcing the sprocket hole regions can be enhanced. Preferably, when such a plating layer is provided, the suitable number of sprocket holes included in a group separated by the slits is appropriately controlled, in consideration of the difference in material-based physical properties of the insulating layer and the metallic layer.

As described hereinabove, according to the present invention, the metallic layer is provided in a discontinuous manner in the longitudinal direction of the insulating layer by provision of slits on the insulating layer at intervals of three to eight said sprocket holes. Through employment of the above structure, stress produced between the metallic layer and the insulating layer is appropriately released by the provided slits, thereby preventing wavy deformation along the longitudinal edges of the both sides of the film carrier tape.

What is claimed is:

1. A film carrier tape for mounting electronic devices thereon, comprising
    a continuous insulating layer;
    a wiring pattern formed of a conductor layer provided on a surface of the insulating layer;
    a row of sprocket holes provided along respective longitudinal edges of the insulating layer, which said row of sprocket holes are at the outer sides of the wiring pattern; and
    a metallic layer formed around said row of sprocket holes, wherein the metallic layer is provided in a discontinuous manner in the longitudinal direction of the insulating layer by provision of slits on the insulating layer at intervals of three to eight said sprocket holes.

2. A film carrier tape for mounting electronic devices thereon according to claim 1, wherein the metallic layer has a length in the longitudinal direction of 10 to 40 mm, corresponding to three to eight said sprocket holes.

3. A film carrier tape for mounting electronic devices thereon according to claim 1, wherein the outer longitudinal edge of the metallic layer is set back from its corresponding closest longitudinal edge of the insulating layer at a predetermined distance.

4. A film carrier tape for mounting electronic devices thereon according to claim 2, wherein the outer longitudinal edge of the metallic layer is set back from its corresponding closest longitudinal edge of the insulating layer at a predetermined distance.

* * * * *